United States Patent
Oh et al.

[11] Patent Number: 6,113,754
[45] Date of Patent: Sep. 5, 2000

[54] SPUTTERING APPARATUS HAVING A TARGET BACKING PLATE EQUIPPED WITH A COOLING LINE AND SPUTTERING METHOD USING THE SAME

[75] Inventors: Jung-suk Oh; Yoon-sei Park, both of Seoul; Gyu-hwan Kwag, Suwon, all of Rep. of Korea

[73] Assignee: Samsung Electronics Co., Ltd., Suwon, Rep. of Korea

[21] Appl. No.: 09/313,197

[22] Filed: May 18, 1999

[30] Foreign Application Priority Data

Jul. 2, 1998 [KR] Rep. of Korea ............... 98-26617

[51] Int. Cl.[7] ................ C13C 14/34; C23C 14/40
[52] U.S. Cl. .................. 204/192.17; 204/192.15; 204/192.12; 204/192.16; 204/298.03; 204/298.07; 204/298.09; 204/298.12; 204/298.13
[58] Field of Search ............... 204/192.15, 192.12, 204/192.16, 192.17, 298.09, 298.07, 298.12, 298.13, 298.03

[56] References Cited

U.S. PATENT DOCUMENTS 5,334,302  8/1994  Kubo et al. .............. 204/298.18
5,567,267 10/1996  Kazama et al. .............. 156/345
5,985,115 11/1999  Hartsough et al. ........... 204/298.09

FOREIGN PATENT DOCUMENTS 1-177368  7/1989  Japan .

Primary Examiner—Alan Diamond
Attorney, Agent, or Firm—Jones Volentine, LLP

[57] ABSTRACT

A sputtering apparatus for manufacturing semiconductor devices, and a sputtering method using the same, allows for the formation of metal layers having good step coverage and good deposition rate. The sputtering apparatus for manufacturing semiconductor devices includes a process chamber; a target; a backing plate for the target; a cooling gas line on or in the backing plate, such that a cooling gas for cooling the target is circulated through the cooling gas line; and a cooling gas supply apparatus for supplying, discharging and recirculating cooling gas to and from the cooling gas line of the backing plate. The sputtering process is carried out with a high frequency power applied at 15 kW to 45 kW, argon gas supplied at 3 sccm to 10 sccm, and inner pressure in the process chamber at 0.1 mTorr to 1 mTorr. This sputtering apparatus does not require a collimator, therefore none of the particles generated when using a collimator are present to damage the wafers processed in this apparatus.

12 Claims, 4 Drawing Sheets

SPUTTERING APPARATUS HAVING A TARGET BACKING PLATE EQUIPPED WITH A COOLING LINE AND SPUTTERING METHOD USING THE SAME

BACKGROUND OF THE INVENTION

1. Field of the Invention

The present invention relates to a sputtering apparatus for manufacturing semiconductor devices and a sputtering method using the same, and more particularly, to a sputtering apparatus having a target backing plate equipped with a cooling line for cooling the target so as to achieve a good step coverage and a good deposition rate while depositing metal layers on wafers.

2. Background of the Related Art

Generally, one of the last steps in semiconductor device fabrication is forming a metal layer on a semiconductor substrate for pattern formation. The metal layer formation process is critical to production yield and the reliability of semiconductor devices, and is generally carried out by a sputtering method. The sputtering method provides easy control of the deposition rate for the metal layer, good surface characteristics, and selection from a wide variety of materials.

The sputtering process is carried out such that a reaction gas, e.g., argon gas (Ar), supplied inside a process chamber is turned into a plasma state, and positive ions of the reaction gas in the plasma state collide with a target so as to extract target atoms, which are deposited on the wafer.

FIG. 1 is a schematic diagram showing a conventional sputtering apparatus for manufacturing semiconductor devices, which comprises a process chamber 10 in which a sputtering process is carried out in a vacuum state by operation of a vacuum pump (not shown). A stage 16 is located in a lower portion of the inside of a process chamber 10, and the stage 16 serves as an anode on which a wafer 18 to be processed is mounted. In the upper portion of the process chamber 10, opposite the stage 16, there is provided a target 12 which serves as a cathode.

In addition, a backing plate 14 is provided on the back side of the target 12, and a cooling water line (not shown) is provided inside the backing plate 14 for supplying cooling water to control the temperature of the target 12. One end of the cooling water line is connected to a cooling water supply source 24 via a cooling water supply line 22, and the other end of the cooling water line is connected to a cooling water discharge line 23. The cooling water supplied from the cooling water supply source 24 passes through the cooling water supply line 22, and is supplied to the cooling water line so as to cool the target 12 coupled with the backing plate 14, and is thereafter discharged.

A high frequency power source 26 is connected to the target 12, which forms an electric field between the stage 16 and the target 12. On one side of the process chamber 10, there is provided a gas supply line 20 for supplying a reaction gas, such as argon gas (Ar), into the process chamber 10.

Therefore, after locating a wafer 18 on the stage 16 inside the process chamber 10 where a specific vacuum state is formed by operating a vacuum pump (not shown), reaction gas is supplied into the process chamber 10 through the gas supply line 20.

Then, on receipt of 10 kW to 12 kW from the power source 26, an electric field is formed between the target 12 and the stage 16, and the reaction gas supplied into the process chamber 10 is accelerated by the electric field and turned into the plasma state. The positive ions of the reaction gas in the plasma state move toward the target 12 which functions as a negative electrode, and collide with the target 12 so as to extract target atoms from the target 12. The extracted atoms from the target 12 are deposited on the wafer 18.

The repeated collisions between the positive ions of the reaction gas in the plasma state and the target 12 generate heat, and the heat from the target 12 is removed by the cooling water passing through the cooling water line of the backing plate 14 coupled with the target 12, after which it is discharged into the cooling water discharge line 23.

However, with the high-integration of multi-layered semiconductor devices, contact sizes are becoming smaller, and their depths are becoming deeper, so that the step coverage of the metal layer deposited on the wafer is becoming more difficult. Attempts have been made to improve the step coverage, such as the installation of a collimator between the target and the wafer, and controlling the inner pressure of the process chamber.

However, installing a collimator between the target and the wafer causes a problem in that the target material is filtered at the collimator so that the deposition rate of target atoms deposited on the wafer is decreased. In addition, particles generated from the target atoms deposited on the collimator contaminate the wafer during subsequent processes. Therefore, an improved sputtering apparatus and sputtering method are needed to improve both the step coverage of metal layers deposited on the wafer and the deposition rate.

SUMMARY OF THE INVENTION

The present invention is directed to a sputtering apparatus for manufacturing semiconductor devices and a sputtering method using the same for forming metal layers having good step coverage and good deposition rate by applying a high frequency power while easily cooling a target of the sputtering apparatus.

To achieve this and other advantages and in accordance with the purpose of the present invention, as embodied and broadly described, the sputtering apparatus for manufacturing semiconductor devices comprises a process chamber for carrying out a sputtering process for a wafer; a target installed a certain distance from the wafer in an upper portion of the process chamber; a backing plate adjacent to the target and having a cooling gas line provided such that a cooling gas for cooling down the target is circulated through the cooling gas line; and a cooling gas supply apparatus for supplying, discharging and recirculating the cooling gas to and from the cooling gas line.

The cooling gas supply apparatus comprises a cooling gas circulation line for connecting a cooling gas discharge port of the cooling gas line to a cooling gas supply port of the cooling gas line; a compressor installed on the cooling gas circulation line for compressing and liquefying the cooling gas discharged from the cooling gas discharge port; an expansion valve provided on the cooling gas circulation line between the compressor and the cooling gas supply port for evaporating the liquefied cooling gas; and a pump installed on the cooling gas circulation line between the compressor and the expansion valve for pumping the liquefied cooling gas toward the expansion valve.

In addition, the cooling gas supply port and the cooling gas discharge port of the cooling gas line have temperature detection devices for detecting the supply temperature of the cooling gas and the discharge temperature thereof respectively.

Meanwhile, with the wafer installed in the process chamber and spaced apart from the target by 150 mm to 400 mm, the target material can flow directly toward the wafer and be deposited on the wafer with a good step coverage without using a collimator. The method for doing so comprises the steps of: loading the wafer on a stage inside the process chamber; applying a high frequency power of 15 kW to 45 kW to the target; supplying a reaction gas into the sputtering apparatus at a rate of 3 sccm to 10 sccm; maintaining the inner pressure of the sputtering apparatus at 0.1 mTorr to 1 mTorr; and sputtering the target material on the wafer. The target is maintained at a low temperature such as 0° C. to 15° C. during the sputtering by circulating, discharging, and recirculating cooling gas inside the backing plate on which the target is mounted, so as to achieve a good deposition rate.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention in which.

Figure 5:
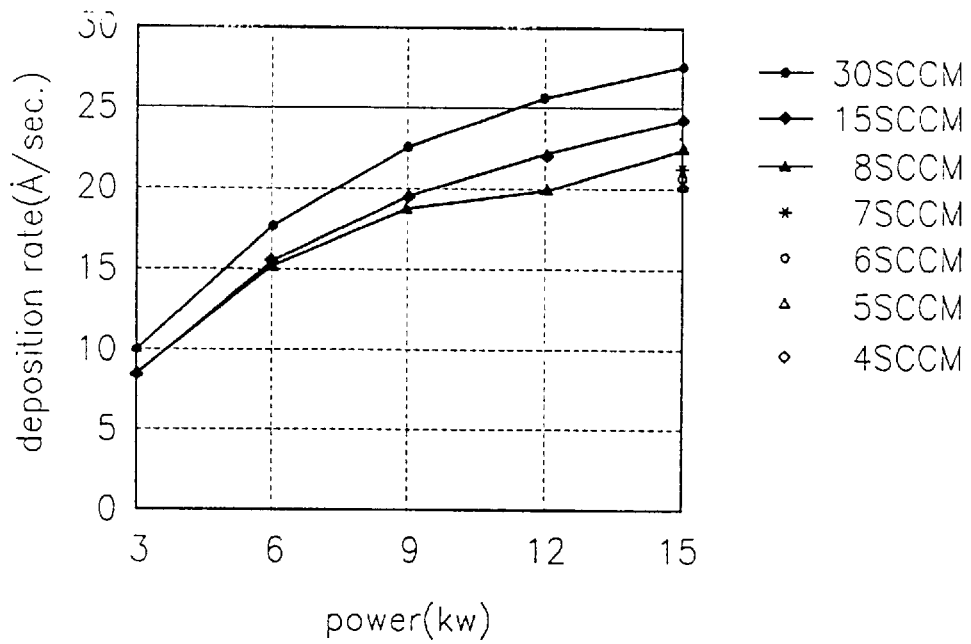
Figure 6:
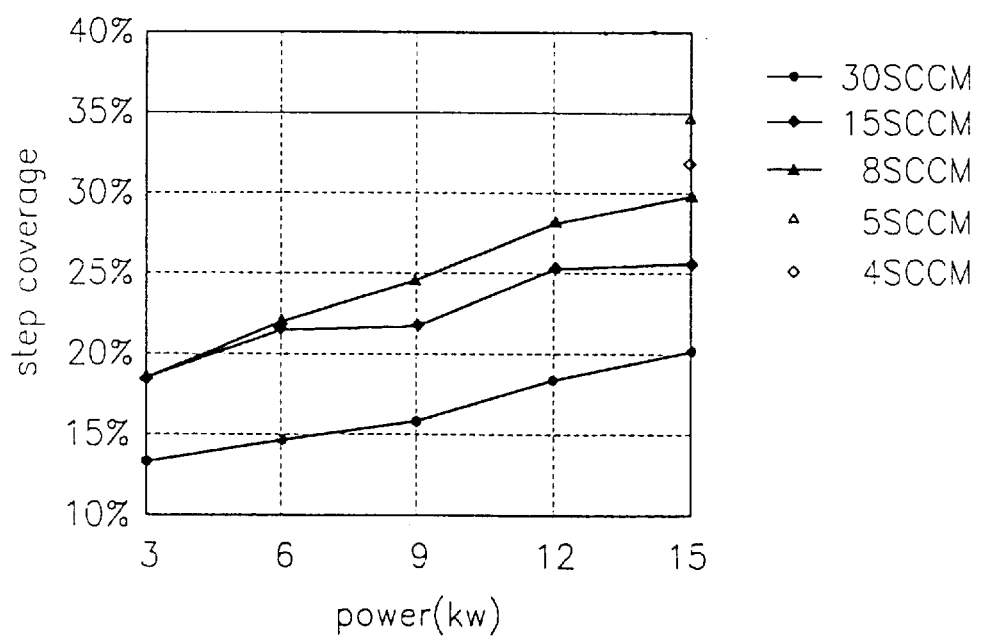

FIG. 5 is a graphical representation showing the variance of the deposition rate of the titanium (Ti) layer formed on the wafer by the sputtering method for manufacturing semiconductor devices according to the present invention; and FIG. 6 is a graphical representation showing the variance of the step coverage of the titanium (Ti) layer formed on the wafer by the sputtering method for manufacturing semiconductor devices according to the present invention.

DETAILED DESCRIPTION OF PREFERRED EMBODIMENTS

Figure 1:
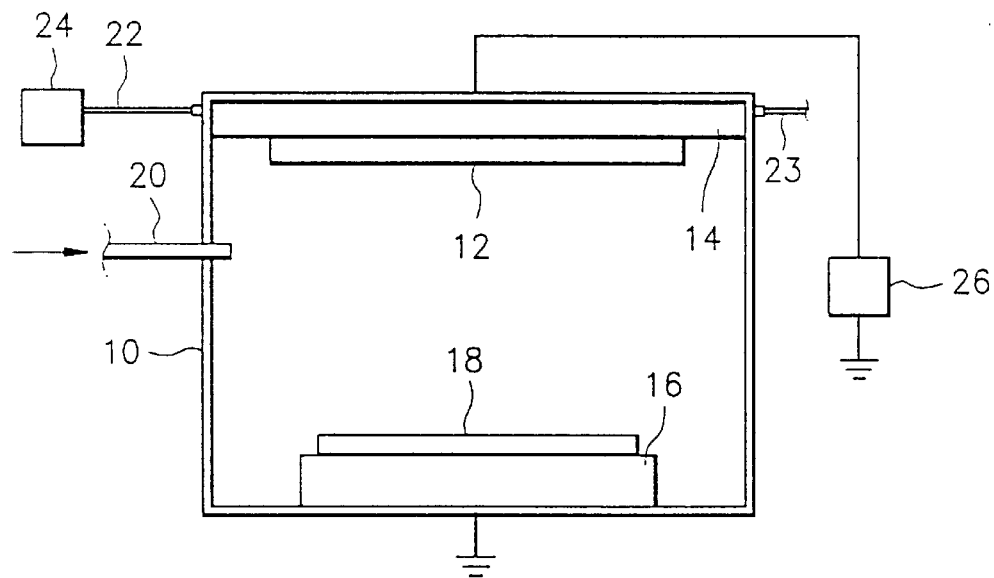
FIG. 1 is a schematic diagram showing a conventional sputtering apparatus for manufacturing semiconductor devices.
Figure 2:
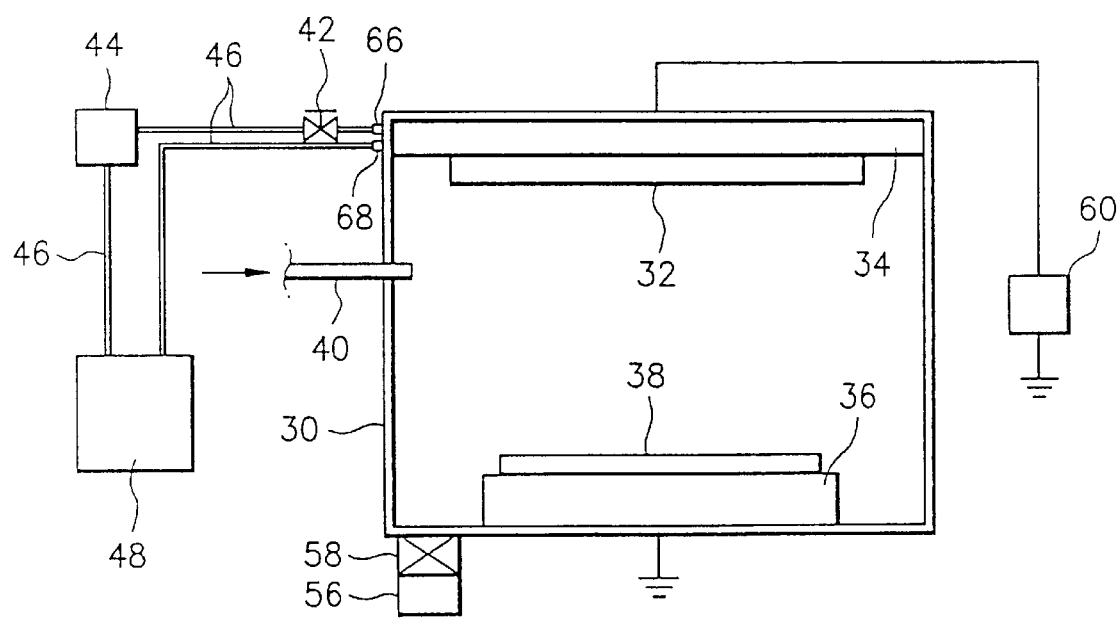
FIG. 2 is a schematic diagram showing a sputtering apparatus for manufacturing semiconductor devices according to one embodiment of the present invention.

Preferred embodiments of the present invention will now be described in detail with reference to the accompanying drawings. FIG. 2 schematically shows one embodiment of the sputtering apparatus for manufacturing semiconductor devices according to the present invention, having a process chamber 30 in which a sputtering process deposits a metal layer, e.g., titanium (Ti), on the wafer.

On one side of the process chamber 30, there is provided a gas supply line 40 for supplying a reaction gas such as argon gas (Ar) into the process chamber 30, and on another side of the process chamber 30, there is provided a vacuum pump 56 for controlling the pressure inside the process chamber 30 with a valve 58 thereon. By opening the valve 58 between the process chamber 30 and the vacuum pump 56, and driving the vacuum pump 56, a high vacuum state is formed inside the process chamber 30.

In a lower portion of the process chamber 30, there is provided a stage 36 which functions as an anode, on which the wafer 38 to be sputtered is mounted. In an upper portion of the process chamber 30 opposite the stage 36, there is provided a target 32 which is made of titanium (Ti) material for example, which functions as a cathode. The stage 36 and the target 32 are spaced apart from each other by at least 150 mm, preferably, 150 mm to 400 mm, for an LTS (long throw sputtering) method.

In addition, a high frequency power source 60 is connected to the target 32, the target 32 and the stage 36 are grounded, and an electric field is formed between the stage 36 and the target 32 by the specific high frequency power applied by the power source 60.

Figure 3:
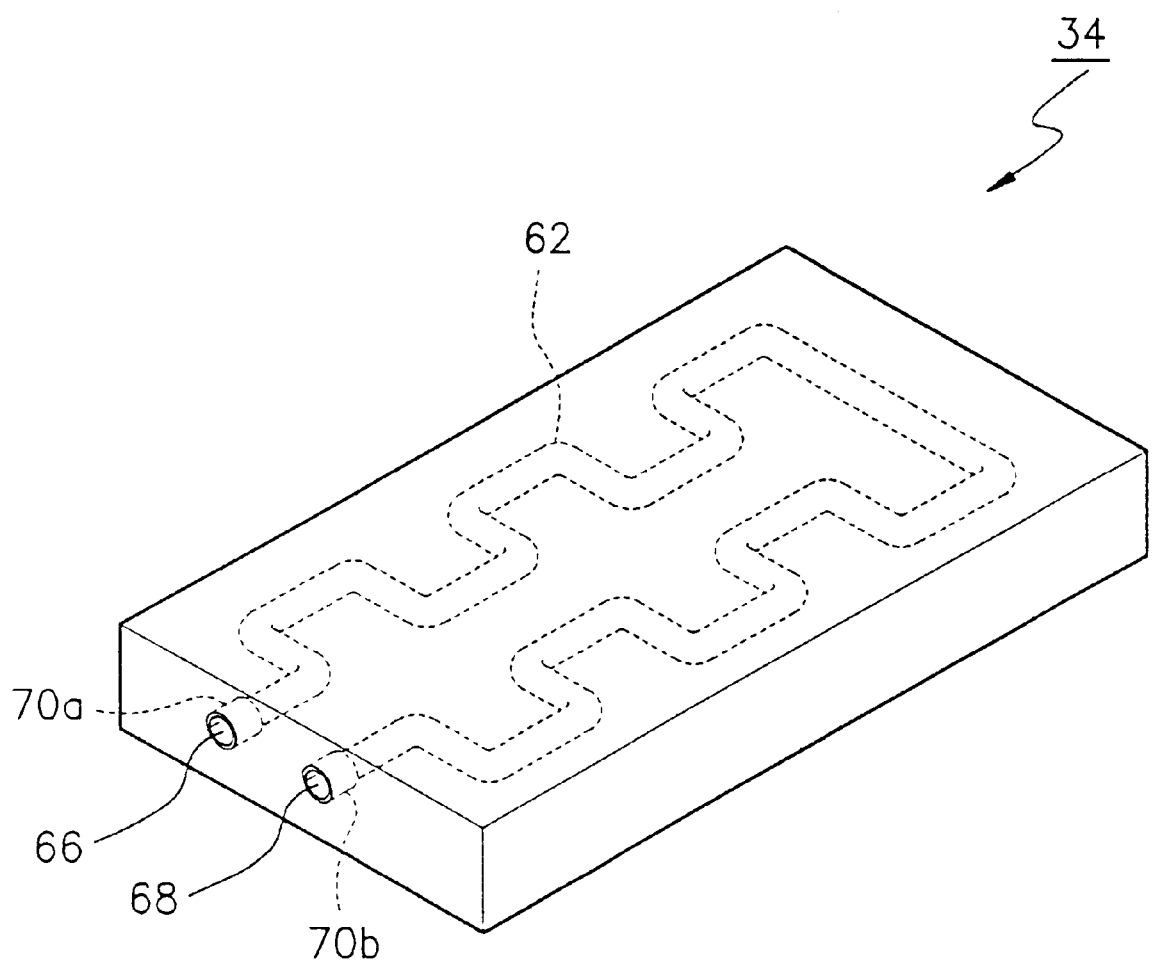
FIG. 3 is a perspective view showing a backing plate of the sputtering apparatus for manufacturing semiconductor devices of the FIG. 2.

On the back side of the target 32, a backing plate 34, as shown in FIG. 3, is provided. The backing plate 34 is made of a titanium material, and the target 32 and the backing plate 34 can be coupled by any suitable method, e.g., solder bonding, diffusion bonding and epoxy bonding. Inside the backing plate 34, there is provided a cooling gas line 62, which has an undulating shape with a plurality of inflection points so as to increase the surface area of contact between the cooling gas line and the inside of the backing plate 34 as shown in FIG. 3. A cooling gas such as nitrogen gas ($N_2$), argon gas (Ar), Freon gas, helium gas (He), or the like, flows through the cooling gas line 62.

A first temperature detection device 70a is provided proximate to a cooling gas supply port 66 located at a first end of the cooling gas line, the cooling gas supply port 66 serving as an inlet of the cooling gas line 62. A second temperature detection device 70b is provided proximate to a cooling gas discharge port 68 located at a second end of the cooling gas line, the cooling gas port 68 serving as an outlet of the cooling gas line 62. The first temperature detection device 70a and the second temperature detection device 70b detect the temperature of the cooling gas passing through the cooling gas supply port 66 and the cooling gas discharge port 68 respectively. The temperature detection devices described above and hereafter may be selected from any suitable temperature detection device known to one of ordinary skill in the art. The cooling gas line 62 can be installed outside the backing plate 34 and in contact therewith, instead of inside the backing plate 34.

In addition, the cooling gas supply port 66 and the cooling gas discharge port 68 can be connected to each other by a cooling gas circulation line 46 as shown in FIG. 2. A compressor 48 is provided on the cooling gas circulation line 46 for compressing and liquefying the cooling gas flowing from the cooling gas discharge port 68. An expansion valve 42 is located between the compressor 48 and the cooling gas supply port 66 for expanding and evaporating the liquefied cooling gas. There is a pump 44 on the cooling gas circulation line 46 between the compressor 48 and the expansion valve 42 for easily circulating the liquefied cooling gas.

Figure 4:
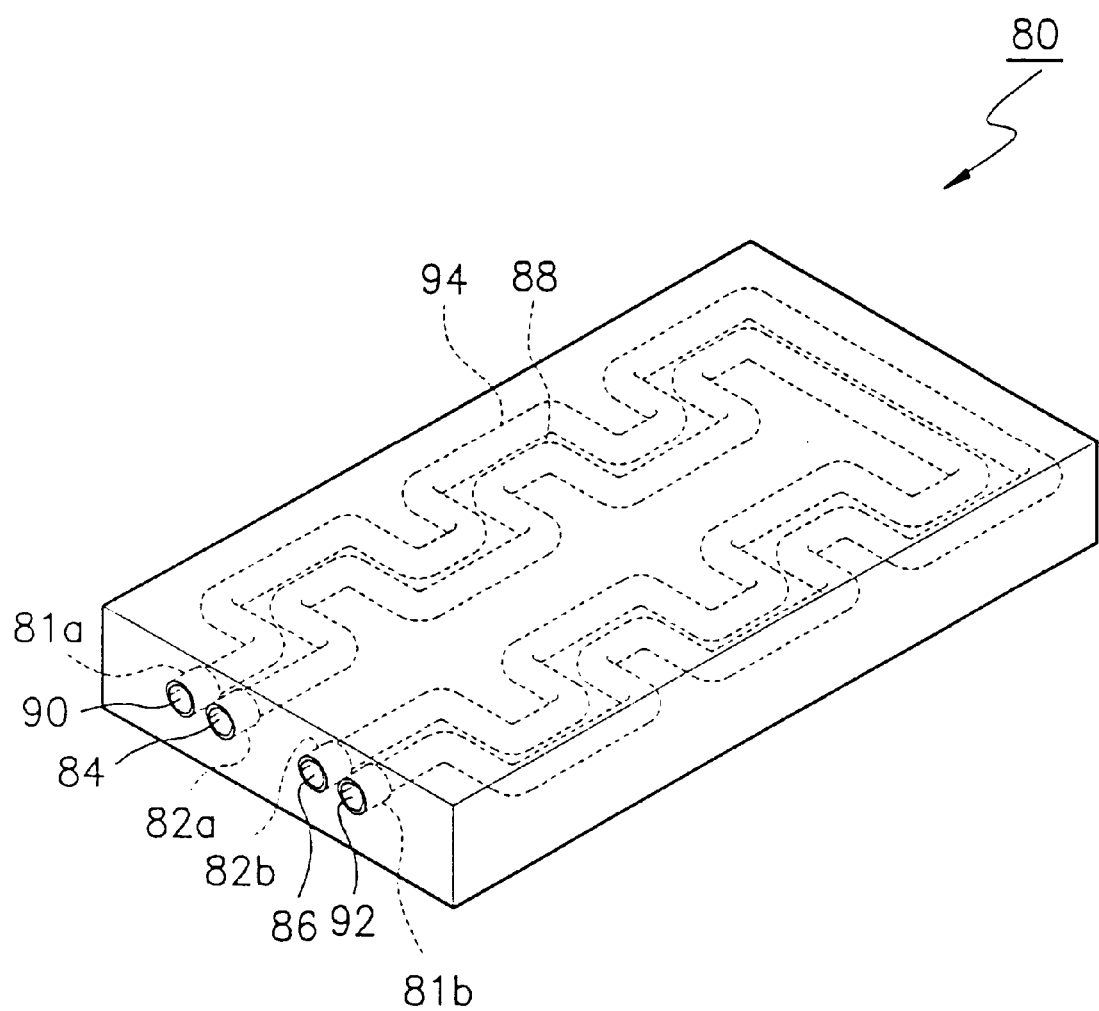
FIG. 4 is a perspective view showing a backing plate of the sputtering apparatus for manufacturing semiconductor devices according to another embodiment of the present invention.

Another embodiment of a backing plate for the sputtering apparatus of the present invention is shown in FIG. 4, in which a cooling water line 94 and a cooling gas line 88 are provided inside the backing plate 80. The cooling water line 94 and the cooling gas line 88 have an undulating shape with a plurality of inflection points so as to increase their contact surface area with the inside of the backing plate 80.

On one end of the cooling water line 94, there is provided a cooling water supply port 90 having a first temperature detection device 81a, and on the other end of the cooling water line 94, there is provided a cooling water discharge port 92 having a second temperature detection device 81b. On one end of the cooling gas line 88, there is provided a cooling gas supply port 84 having a first temperature detection device 82a, and on the other end of the cooling gas line 88, there is provided a cooling gas discharge port 86 having a second temperature detection device 82b. The first temperature detection devices 81a, 82a are arranged to measure the temperature of the cooling water and the cooling gas which are supplied, and the second temperature detection devices 81b, 82b are arranged to measure the temperature of the cooling water and the cooling gas which are discharged. Alternatively, the cooling water line 94 and the cooling gas line 88 can be installed outside the backing plate 80 and in contact therewith, instead of inside the backing plate 80.

In either case, cooling water is supplied through the cooling water supply port 90 into the cooling water line 94, and is discharged through the cooling water discharge port 92. A cooling gas at a low temperature is supplied through the cooling gas supply port 84 into the cooling gas line 88, and is discharged through the cooling gas discharge port 86.

The temperature of the target 32 which contacts with the backing plate 80 is controlled by supplying the cooling water and the cooling gas into the cooling water line 94 and the cooling gas line 88 respectively. The temperature of the cooling water and the cooling gas supplied into the backing plate 80 are measured by the first temperature detection devices 81a, 82a. The temperature of the cooling water and the cooling gas discharged out of the backing plate 80 are measured by the second temperature detection devices 81b, 82b. The difference between the temperatures detected is used to determine the supply temperature and the supply time of the cooling water and the cooling gas supplied into the backing plate 80.

In the meantime, a sputtering process using the sputtering apparatus as shown in FIGS. 2 and 3 is carried out as follows. First, after loading the wafer 38 to be processed inside the process chamber 30, the temperature of the titanium material of the target 32, which generates heat when high frequency power is applied, is reduced using the cooling gas which is cooled to less than 15° C., preferably to between −20° C. and 15° C., and more preferably between 0° C. and 15° C. The inner temperature of the process chamber 30 is maintained at room temperature, preferably at between 20° C. and 25° C. As shown in Table 1 below, argon gas was supplied into the process chamber 30 at rates of 4, 5, 6, 7, 8, 15, and 30 sccm (standard cubic centimeter per minute), and power was applied to the target 32 at levels of 3, 6, 9, 12, and 15 kW. The deposition rate and the step coverage according to the sputtering process were measured. The critical dimension (CD) of the contact on the wafer was 0.4 μm, and its aspect ratio was 3.3.

The inner pressure in the process chamber during the sputtering process was less than 1 mTorr, preferably, 0.1 mTorr to 1 mTorr. The results of the sputtering process are shown in Table 1 below, and in FIGS. 5 and 6.

TABLE 1

| Applied Power | Deposition rate (Å/sec.) | | | | | | | Step coverage (%) | | | | |
| --- | --- | --- | --- | --- | --- | --- | --- | --- | --- | --- | --- | --- |
| (kW) | 4 sccm | 5 sccm | 6 sccm | 7 sccm | 8 sccm | 15 sccm | 30 sccm | 4 sccm | 5 sccm | 8 sccm | 15 sccm | 30 sccm |
| 3 | — | — | — | — | 9.26 | 9.26 | 10.10 | — | — | 18.2 | 18.2 | 13.3 |
| 6 | — | — | — | — | 15.28 | 15.56 | 17.78 | — | — | 21.8 | 21.4 | 14.7 |
| 9 | — | — | — | — | 18.39 | 19.23 | 22.38 | — | — | 24.7 | 21.8 | 15.6 |
| 12 | — | — | — | — | 19.84 | 21.83 | 25.79 | — | — | 28.0 | 25.5 | 18.5 |
| 15 | 20.18 | 20.18 | 21.05 | 21.49 | 21.93 | 24.12 | 27.63 | 32.6 | 34.8 | 30.0 | 25.5 | 20.6 |

Referring to Table 1, and FIGS. 5 and 6, when supplying argon gas into the process chamber 30 at 8, 15, and 30 sccm, while increasing the applied power on the target 32 from 3 kW to 15 kW, the deposition rate and the step coverage of the titanium layer on the wafer were all increased.

In general, for the same applied power, the deposition rate decreased slightly when the amount of argon gas supplied into the process chamber 30 was decreased, but the step coverage increased greatly. Note that at an applied power of 15 kW, the deposition rate generally decreased with a decreased supply of argon gas. However, when the argon gas supply fell below 5 sccm, the deposition rate did not change, but the step coverage decreased.

Therefore, according to the present invention, the cooling efficiency for the target using the cooling gas is good, allowing high frequency power over 15 kW, preferably between 15 kW to 45 kW, to be applied to the sputtering target. That is, when argon gas is supplied into the process chamber at less than 10 sccm, preferably 3 sccm to 10 sccm, and the inner pressure of the process chamber is maintained at less than 1 mTorr, preferably 0.1 mTorr to 1 mTorr, a good deposition rate of a metal material layer deposited on the wafer is achieved, and step coverage is improved. Further, even without a collimator to make the target material flow directly toward the wafer, the step coverage of the metal material deposited on the wafer is very good, and its deposition rate is very good. As a result, particle generation due to the collimator is prevented, and a reliable process is achieved.

It will be apparent to those skilled in the art that various modifications and variations of the present invention can be made without departing from the spirit or scope of the invention. Thus, it is intended that the present invention cover the modifications and variations of this invention that come within the scope of the appended claims and their equivalents.

What is claimed is:

1. A sputtering apparatus comprising:
   a process chamber in which a sputtering process is carried out on a wafer;
   a stage on which the wafer to be sputtered is supported, said stage being disposed in said process chamber at a lower portion thereof;
   a target disposed in said process chamber at an upper portion thereof and spaced from said stage;
   a backing plate disposed adjacent to the target so as to be in a heat exchange relation therewith, the backing plate having a cooling gas line containing a cooling gas for cooling the target, said cooling gas line having a cooling gas supply port at a first end thereof and a cooling gas discharge port at a second end thereof;
   a cooling gas supply apparatus which supplies said cooling gas to the cooling gas line via said cooling gas supply port during the sputtering process, discharges said cooling gas from the cooling gas line via said cooling gas discharge port, and recirculates said cooling gas to said cooling gas supply port of the cooling gas line, whereby heat is removed from the target by the cooling gas during the sputtering process; and
   temperature detection devices located at said cooling gas supply port and said cooling gas discharge port of the cooling gas line so as to detect the temperature of the cooling gas supplied to the cooling gas line and the temperature of the cooling gas discharging from the cooling gas line, respectively.

2. The sputtering apparatus of claim 1, wherein the cooling gas supply apparatus comprises:
   a cooling gas circulation line connecting said cooling gas discharge port of the cooling line to said cooling gas supply port of the cooling gas line;
   a compressor installed on the cooling gas circulation line, for compressing and liquefying the cooling gas discharged from the cooling gas discharge port;
   an expansion valve provided on the cooling gas circulation line between the compressor and the cooling gas supply port for evaporating the liquefied cooling gas; and
   a pump installed on the cooling gas circulation line between the compressor and the expansion valve, for pumping the liquefied cooling gas toward the expansion valve.

3. The sputtering apparatus of claim 1, wherein said backing plate has a main body in the form of a plate, and the cooling gas line extends inside the main body.

4. The sputtering apparatus of claim 1, wherein the cooling gas is one selected from the group consisting of nitrogen gas ($N_2$), argon gas (Ar), Freon gas, and helium gas (He).

5. The sputtering apparatus of claim 1, wherein the distance between the stage and the target is 150 mm to 400 mm.

6. The sputtering apparatus of claim 1, wherein the backing plate further comprises a cooling water line for circulating cooling water therethrough.

7. A sputtering method comprising:
   a) loading a wafer onto a stage inside a process chamber of a sputtering apparatus; and
   b) depositing a target material on the wafer, wherein the depositing comprises
      applying a high frequency power of 15 kW to 45 kW to a target installed over the wafer,
      supplying a reaction gas into the sputtering apparatus at a rate of 3 sccm to 10 sccm,
      maintaining an inner pressure in the sputtering apparatus of 0.1 mTorr to 1 mTorr, and
      sputtering the target material on the wafer.

8. The sputtering method of claim 7, wherein the distance between the stage and the target is 150 mm to 400 mm.

9. The sputtering method of claim 7, wherein the temperature of the target is maintained at 0° C. to 15° C. during sputtering.

10. The sputtering method of claim 9, wherein the temperature of the target is maintained by supplying a cooling gas to a backing plate of the target, discharging the cooling gas from the backing plate, and recirculating the cooling gas to the backing plate.

11. The sputtering method of claim 7, wherein an inner temperature in the process chamber during the sputtering is maintained at room temperature.

12. The sputtering method of claim 7, wherein the target is made of titanium (Ti), and the reaction gas is argon gas (Ar).

* * * * *